US008456213B2

(12) United States Patent
Lee

(10) Patent No.: US 8,456,213 B2
(45) Date of Patent: Jun. 4, 2013

(54) INITIALIZATION CIRCUIT AND BANK ACTIVE CIRCUIT USING THE SAME

(75) Inventor: Jong Won Lee, Gwangmyeong-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 13/526,366

(22) Filed: Jun. 18, 2012

(65) Prior Publication Data

US 2012/0256663 A1    Oct. 11, 2012

Related U.S. Application Data

(62) Division of application No. 12/455,566, filed on Jun. 3, 2009, now Pat. No. 8,222,942.

(30) Foreign Application Priority Data

Dec. 5, 2008 (KR) .......................... 10-2008-0123544

(51) Int. Cl.
*H03K 3/02* (2006.01)
(52) U.S. Cl.
USPC ............................... 327/198; 327/99; 327/142
(58) Field of Classification Search
USPC .............. 327/198, 142, 143, 99, 407; 365/22, 365/189.09, 230.06, 233
See application file for complete search history.

(56) References Cited

U.S. PATENT DOCUMENTS

| 4,366,373 | A | 12/1982 | Metcalf |
| 6,359,823 | B2 | 3/2002 | Mullarkey |
| 6,990,032 | B2 | 1/2006 | Jang |
| 7,286,377 | B1 * | 10/2007 | Pyeon ............................. 365/22 |
| 7,317,648 | B2 | 1/2008 | Jo |
| 7,474,544 | B2 | 1/2009 | Chen |
| 7,768,859 | B2 | 8/2010 | Oh |
| 2003/0214344 | A1 | 11/2003 | Suwa et al. |
| 2007/0109828 | A1 | 5/2007 | Lee |
| 2007/0147154 | A1 | 6/2007 | Pandian et al. |
| 2009/0279373 | A1 | 11/2009 | Han |

FOREIGN PATENT DOCUMENTS

| KR | 10-2003-0003856 A | 1/2003 |
| KR | 10-2005-0028076 A | 3/2005 |
| KR | 10-2005-0093217 A | 9/2005 |

OTHER PUBLICATIONS

Office Action issued Sep. 23, 2010 in connection with U.S. Appl. No. 12/150,403, filed Apr. 28, 2008.
Office Action issued Jan. 24, 2011 in connection with U.S. Appl. No. 12/150,403, filed Apr. 28, 2008.
Office Action issued Jul. 11, 2011 in connection with U.S. Appl. No. 12/150,403, filed Apr. 28, 2008.
Office Action issued Dec. 28, 2011 in connection with U.S. Appl. No. 12/150,403, filed Apr. 28, 2008.
Notice of Allowance issued Feb. 9, 2012 in connection with U.S. Appl. No. 12/150,403, filed Apr. 28, 2008.

* cited by examiner

*Primary Examiner* — Long Nguyen
(74) *Attorney, Agent, or Firm* — John P. White; Cooper & Dunham LLP

(57) ABSTRACT

An initialization circuit comprises a section signal generator generating a section signal, of which a prescribed section is enabled in response to a power-up signal, a first oscillator generating a first period signal in response to the section signal, a first period multiplier generating a first multiplied signal by multiplying a period of the first period signal, and a signal selector transferring the first multiplied signal or a second multiplied signal selectively as a self-refresh enable signal in response to the section signal.

7 Claims, 9 Drawing Sheets

INITIALIZATION CIRCUIT AND BANK ACTIVE CIRCUIT USING THE SAME

This application is a divisional of U.S. application Ser. No. 12/455,566 filed Jun. 3, 2009 now U.S. Pat. No. 8,222,942 claiming priority of Korean Patent Application No. 10-2008-0123544, filed Dec. 5, 2008.

TECHNICAL FIELD

The present invention relates to a semiconductor memory device, and more particularly to an initialization circuit and a bank active circuit using the same which allows a level stabilization of an internal voltage to be performed stably.

BACKGROUND

Generally, the semiconductor memory device is supplied with an external voltage VDD and a ground voltage VSS from the outside and generates an internal voltage which is necessary for an internal operation. As the voltage which is necessary for the internal operations of the semiconductor memory device, a core voltage VCORE supplied to a memory core region, a high voltage VPP used to drive or overdrive a word line, a back bias voltage VBB supplied as a bulk voltage of NMOS transistor in the core region, and a bitline pre-charge voltage VBLP supplied to a bit-line pair BL, BLB during a precharge operation.

Herein, the core voltage Vcore may be supplied by reducing the external voltage VDD at a certain level. However, since the high voltage VPP maintains a level higher than the power source voltage VDD inputted from the outside, and the back-bias voltage VBB maintains a level lower than the power source voltage VDD input from the outside, a charge pump circuit is needed to supply charges for high voltage VPP and the back-bias voltage VBB in order to supply the high voltage VPP and the back-bias voltage VBB respectively.

FIG. 1 is a graphical diagram showing an external voltage and an internal voltage used for a general semiconductor memory device.

As shown in FIG. 1, after applying the power source to the semiconductor memory device, since a level of the internal voltage (high voltage VPP, core voltage VCORE, bit-line precharge voltage VBLP) is increased until it reaches a prescribed level in accordance with a level of the external voltage VDD, a procedure of stabilizing the level of the internal voltage is needed before a normal operation such as a read or write operation is initialized. Therefore, according to prior semiconductor memory device, the level of the internal voltage is stabilized and thus the normal operation is performed through an initialization operation.

Hereinafter, it will be described on the initialization operation according to a specification of a mobile DDR DRAM shown FIG. 2 for each of time sections shown in FIG. 1.

First, as the level of the external voltage VDD increases, the level of the internal voltage also increases, during a section of 0~t1 sec. Next, the semiconductor memory device becomes NOP state or a deselect state in order to stabilize the clock signal, during a section of t1~t2 sec. The clock signal stabilizing section is determined as approximately 200 μsec.

Next, during a section of t2~t3, the precharge operation is performed for all banks included in the semiconductor memory device and an auto-refresh operation is performed 2 times. Further, a mode register and an extended mode register are set during this section. Then, the normal operations of the semiconductor memory device are carried out at a section after t3 sec.

However, with respect to a recent semiconductor memory device, it tends to omit the 2-times auto-refresh operation which has been performed at the section of t2~t3 sec. Therefore, there is a need for a scheme capable of stabilizing the internal voltage even though the auto-refresh operation is omitted during the initialization operation.

BRIEF SUMMARY

In an aspect of this disclosure, there are provided an initialization circuit and a bank active circuit using the same which allow a level stabilization of an internal voltage to be performed stably by causing a refresh operation to be performed automatically during a clock signal stabilizing section.

In an embodiment, an initialization circuit comprises a section signal generator generating a section signal, a prescribed section of the section signal being enabled in response to a power-up signal, a first oscillator generating a first period signal in response to the section signal, a first period multiplier generating a first multiplied signal by multiplying a period of the first period signal, and a signal selector transferring the first multiplied signal or a second multiplied signal selectively as a self-refresh enable signal in response to the section signal.

Further, a bank active circuit, in another embodiment, comprises an initializing unit generating a self-refresh enable signal which is enabled at least once during a prescribed section after a power-up section is terminated, a bank active signal generating unit receiving the self-refresh enable signal, an active signal, a precharge signal and an auto-refresh signal and generate a bank active signal, and a delay unit delaying the bank active signal by a prescribed amount of time to generate a delay signal for disabling the bank active signal.

Further, in another embodiment, a bank active circuit comprises an initializing unit generating a self-refresh enable signal which is enabled at least once during a prescribed section after the power-up section is terminated, in response to a reset signal, a bank active signal generating unit receiving the self-refresh enable signal, an active signal, a precharge signal and an auto-refresh signal and generate a bank active signal, and a delay unit delaying the bank active signal by a prescribed amount of time to generate a delay signal for disabling the bank active signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intend to limit the scope of the invention.

Figure 1:
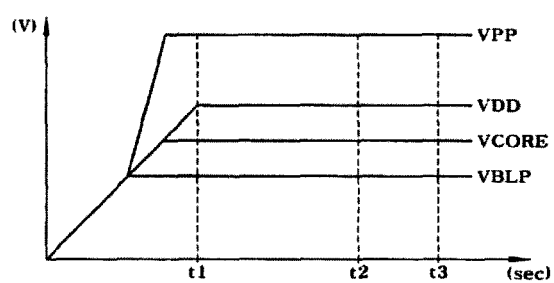
FIG. 1 is a graphical diagram showing an external voltage and an internal voltage used for a general semiconductor memory device.
Figure 2:
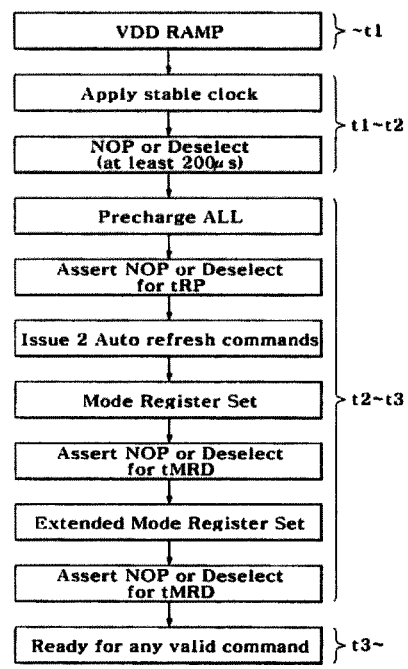
FIG. 2 is a flow chart showing an initialization operation according to a specification of a mobile DDR DRAM.
Figure 3:
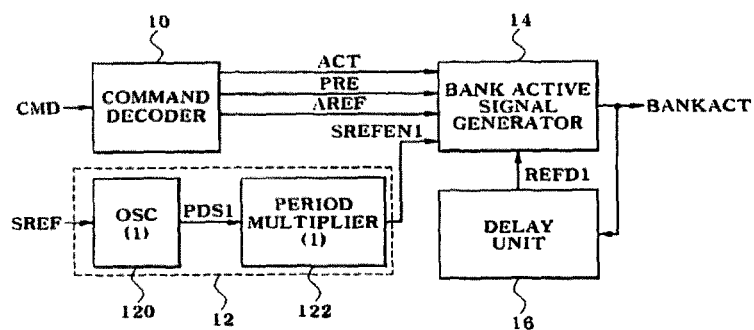
FIG. 3 is a block diagram showing the structure of a bank active circuit according to an embodiment of the present invention.

FIG. 3 is a block diagram showing the structure of a bank active circuit according to a first embodiment of the present invention.

The bank active circuit shown in FIG. 3 consists of a command decoder 10, a self-refresh enable signal generating unit 12, a bank active signal generator 14 and a delay unit 16.

The command decoder 10 receives a command signal CMD and generates an active signal ACT enabled for an active operation, a precharge signal PRE enabled for a precharge operation, and an auto-refresh signal AREF enabled for an auto-refresh operation. The command decoder 10 can be implemented as a general command decoder used in DRAM.

The self-refresh enable signal generating unit 12 is configured with a first oscillator 120 generating a first period signal PDS1 when the self-refresh signal SREF is inputted at the time of a self-refresh operation, and a first period multiplier 122 multiplying a period of the first period signal PDS1 to generate a first self-refresh enable signal SREFEN1. Herein, the first self-refresh enable signal SREFEN1 is generated by multiplying a period of the first period signal PDS1 by 4. Therefore, the period of the first self-refresh enable signal SREFEN1 is 4 times a period of the first period signal PDS1.

The bank active signal generator 14 is configured with a NOR gate NR10 which receives a precharge signal PRE and a first delay signal REFD1 and performs NOR operation, a PMOS transistor P10 which pull-up drives a node nd10 to a power source voltage VDD in response to the output signal from the NOR gate NR10, a logical unit 140 configured to receive the active signal ACT, the auto refresh signal AREF and a first self-refresh enable signal SREFEN1 and performs OR operation, an NMOS transistor N10 which pull-down drives the node nd10 in response to an output signal from the logic unit 140, and a latch 141 connected between the node nd10 and the node nd11. The bank active signal generator 14 generates a bank active signal BANKACT enabled at a high level during the active operation and the auto-refresh operation or if the first refresh enable signal SREFEN1 is input at a high level, and generates a bank active signal BANKACT disabled at a low level during the precharge operation or if the first delay signal REFD1 is enabled at a high level. Herein, the bank active signal BANKACT enabled at a high level causes the banks included in the semiconductor memory device to be activated and the bank active signal BANKACT disabled at a low level causes the banks to be precharged.

The delay unit 16 delays the bank active signal BANKACT by a prescribed amount of time to generate a first delay signal REFD1. Herein, the first delay signal REFD1 is enabled at a high level after a prescribed amount of time is delayed when the bank active signal BANKACT is enabled at a high level.

Figure 5:
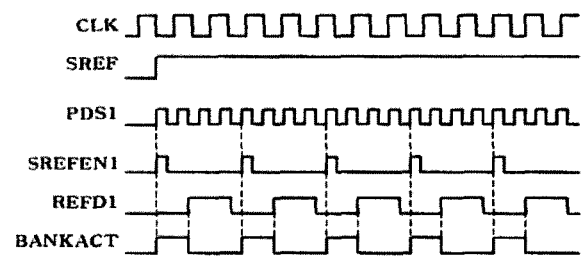
FIG. 5 is a timing diagram illustrating timing in operation of the bank active circuit of FIG. 3.

The operation of such bank active circuit will be hereinafter described referring to FIG. 5.

First, if the self-refresh signal SREF transits to a high level for the purpose of the self-refresh operation, the self-refresh enable signal generating unit 12 generates a pulse of the first self-refresh enable signal SREFEN1. More specifically, the first oscillator 120 generates a first period signal PDS1 by the self-refresh signal SREF of high level and the first period multiplier 122 generates a 4-times multiplied signal of the first period signal PDS1, i.e., the first self-refresh enable signal SREFEN1 having a period of 4 times that of the first period signal PDS1.

Next, the bank active signal generator 14 receives a first self-refresh enable signal SREFEN1 and generates the bank active signal BANKACT enabled at a high level whenever the pulse of the first self-refresh enable signal is inputted.

At this time, the delay unit 16 delays the bank active signal BANKACT of high level by a prescribed amount of time to cause the first delay signal to transit to a high level. The first delay signal REFD1 of high level causes the bank active signal BANKACT to be disabled at a low level. Therefore, the enable section of the bank active signal BANKACT is determined from a section in which the pulse of the first self-refresh enable signal SREFEN1 is inputted to a section in which the first delay signal REFD1 is enabled at a high level.

Figure 6:
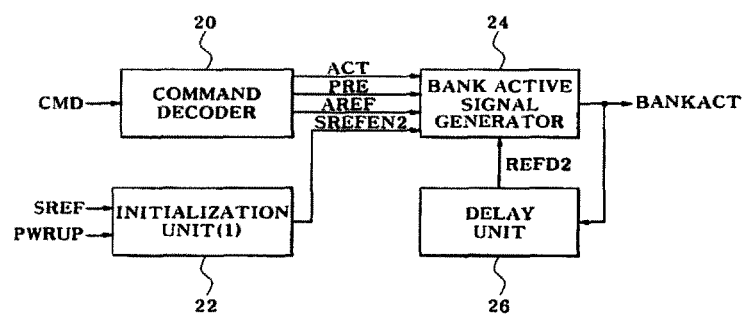
FIG. 6 is a block diagram showing the structure of the bank active circuit according to another embodiment of the present invention.

FIG. 6 is a block diagram showing the structure of a bank active circuit according to an embodiment of the present invention.

The bank active circuit shown in FIG. 6 is configured with a command decoder 20, a first initialization unit 22, a bank active signal generator 24 and a delay unit 26.

Figure 4:
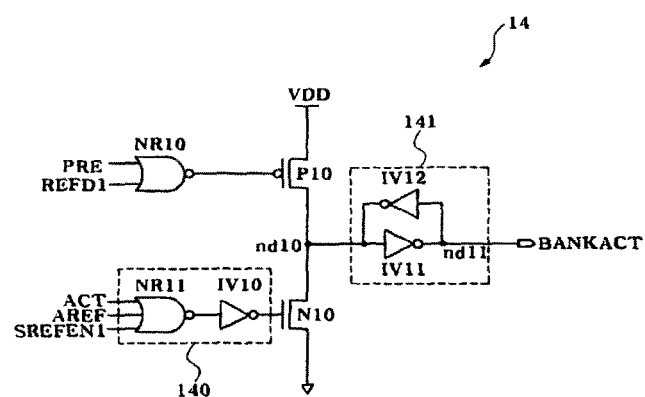
FIG. 4 is a circuit diagram showing a bank active signal generating unit included in the bank active circuit shown in FIG. 3.

The command decoder 20 is implemented as a general command decoder, receives a command signal CMD and generates an active signal ACT enabled for active operation, a precharge signal PRE enabled for precharge operation, and an auto-refresh signal AREF enabled for auto-refresh operation. The bank active signal generator 24 has the same circuit structure as that of the bank active signal generator 14 shown in FIG. 4. Therefore, the bank active signal generator 24 generates a bank active signal BANKACT of a high level during active operation and auto-refresh operation or if the second self-refresh enable signal SREFEN2 is inputted at a high level, and generates a bank active signal BANKACT of a low level during precharge operation or if the second delay signal REFD2 is enabled at a high level. The delay unit 16 delays the bank active signal BANKACT by a prescribed amount of time to generate a second delay signal REFD2.

Figure 7:
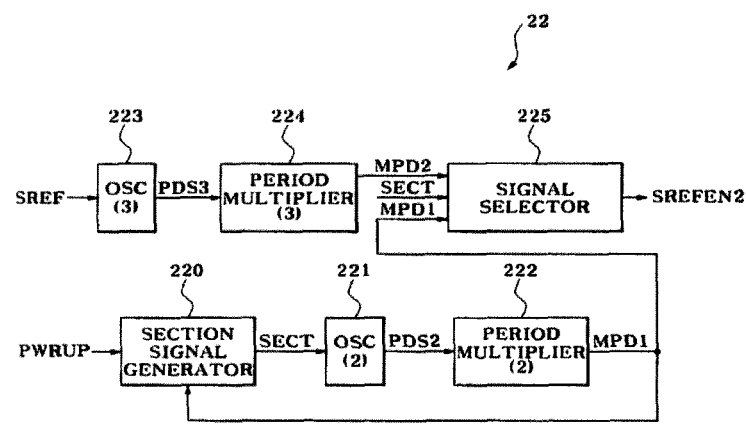
FIG. 7 is a block diagram showing the structure of a first initializing unit included in the bank active circuit of FIG. 6.

The first initializing unit 22 is configured with a section signal generator 220, a second oscillator 221, a second period multiplier 222, a third oscillator 223, a third period multiplier 224 and a signal selector 225, as shown in FIG. 7. The second oscillator 221 is implemented as a general oscillator and receives a section signal SECT to generate a second period signal PDS2. The second period multiplier 222 generates a 4-times multiplied signal of the second period signal PDS2, i.e., a first multiplied signal MPD1 having a period of 4 times that of the second period signal PDS2. The first multiplied signal MPD1 generated by the second period multiplier 222 is fed back and inputted to the section signal generator 220. The third oscillator 223 is implemented as a general oscillator circuit, receives a self-refresh signal SREF of a high level for self-refresh operation and generates a third period signal PDS3. The third period multiplier 224 generates a 4-times multiplied signal of the third period signal PDS3, i.e., a second multiplied signal MPD2 having a period of 4 times that of the third period signal PDS3.

Figure 8:
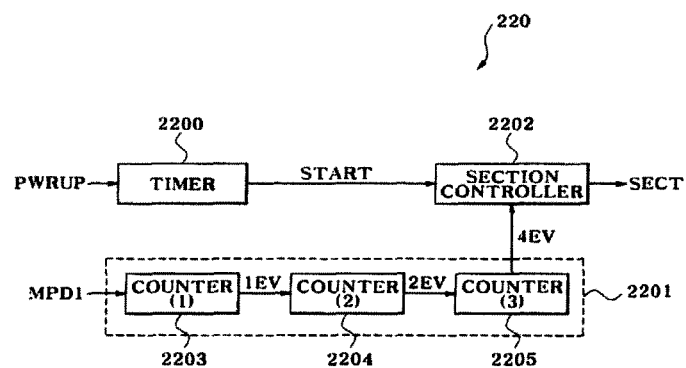
FIG. 8 is a block diagram showing the structure of a section signal generating unit included in the first initializing unit of FIG. 7.

The section signal generator 220 is configured with a timer 2200, a counter unit 2201 and a section controller 2202, as shown in FIG. 8.

The timer 2200 is at a high level during a power-up section, receives a power-up signal PWRUP which transits to a low level after a termination of the power-up section and generates a start signal START. More specifically, the timer 2200 senses a clock signal stabilizing section initiated immediately after the termination of the power-up section, and generates a start signal START enabled at a high level when approximately 199 μsec is elapsed after the clock signal stabilizing section is initiated. Herein, the section in which the start signal START is enabled at a high level can be variably set in accordance with various embodiments.

Figure 9:
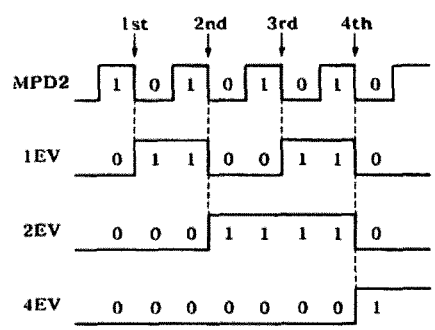
FIG. 9 is a diagram illustrating timing in operation of the section signal generating unit of FIG. 8.

The counter unit 2201 is configured with a first counter 2203 which counts the first multiplied signal MPD1 to generate a 2-times multiplied signal of the first multiplied signal MPD1, i.e., a first counting signal 1EV having a period of 2 times that of the first multiplied signal MPD1, a second counter 2204 which counts the first counting signal 1EV to generate a second counting signal 2EV of 4 time multiplied signal of the first multiplied signal MPD1, and a third counter 2205 which counts the second counting signal 2EV to generate a third counting signal 4EV of 8-times multiplied signal of the first multiplied signal MPD1. The third counting signal 4EV generated by the counter unit 2201 is enabled at a high level if a fourth pulse of the first multiplied signal is inputted. Waveforms of the first counting signal 1EV, the second counting signal 2EV and the third counting signal 4EV generated by the counter unit 2201 are shown in FIG. 9, in which the third counting signal 4EV transits to a high level after the fourth pulse of the first multiplied signal MPD1 is inputted.

Figure 10:
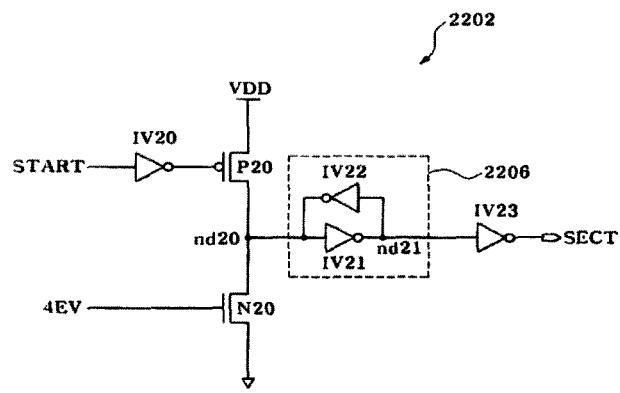
FIG. 10 is a circuit diagram showing a section controller included in the section signal generating unit of FIG. 8.

The section controller 2202 receives a start signal START and the third counting signal 4EV to generate a section signal SECT. As shown in FIG. 10, the section controller 2202 is configured with a PMOS transistor P20 which pull-up drives a node nd20 in response to an inversion signal of the start signal START, an NMOS transistor N20 pull-down driving the node nd20 in response to the third counting signal 4EV, a latch connected between the node nd20 and the node nd21, and an inverter IV23 inverting an output signal from the latch 2206. The section signal SECT generated by the section controller 2202 is driven at a high level from the section in which the start signal START is enabled at a high level to the section in which the third counting signal 4EV is enabled at a high level. In other words, the section signal SECT is enabled at a high level from the section in which approximately 199 μsec is elapsed after the clock signal stabilizing section is initiated to the section in which the fourth pulse of the first multiplied signal MPD1 is generated.

The signal selector 225 consists of a transfer gate T20 which transfers the first multiplied signal MPD1 to the second self-refresh enable signal SREFEN2 in response to a section signal SECT and a transfer gate T21 which transfers the second multiplied signal MPD2 to the second self-refresh enable signal SREFEN2 in response to the section signal SECT. More specifically, the signal selector 225 transfers the first multiplied signal MPD1 as the second self-refresh enable signal SREFEN2 when the section signal SECT is at a high level and transfers the second multiplied signal MPD2 as the second self-refresh enable signal SREFEN2 when the section signal SECT is at a low level.

Referring to FIG. 6 to FIG. 12, operations of such bank active circuit will be hereinafter described.

First, referring to FIG. 8, the power source voltage VDD is stabilized and thus the power-up section is terminated, and the timer 2200 enables the start signal START to be at a high level when approximately 199 μsec is elapsed after the clock signal stabilizing section is initiated. The section controller 2202 enables the section signal SECT to be at a high level if the start signal START transits to a high level.

Figure 12:
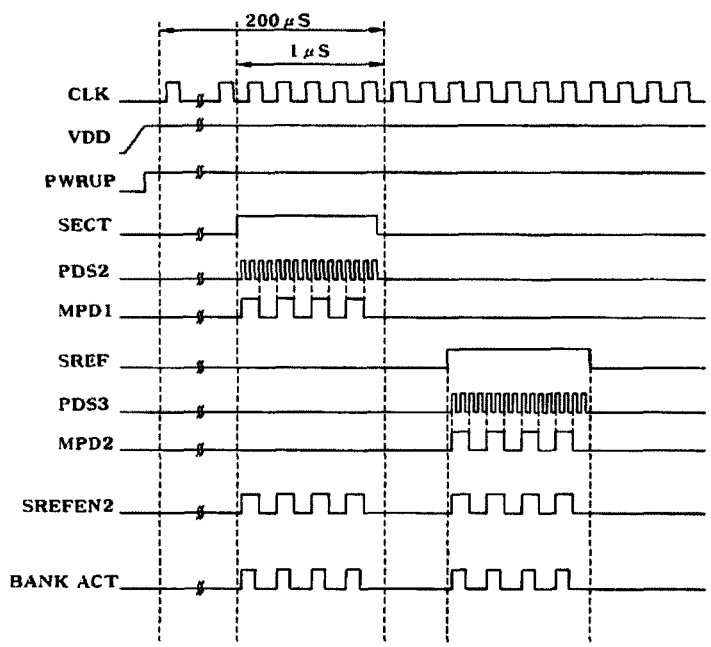
FIG. 12 is a diagram illustrating timing in operation of the bank active circuit of FIG. 6.

Next, referring to FIG. 7, the second oscillator 221 receives the section signal SECT to generate the second period signal PDS2, and the second period multiplier 222 generates the first multiplied signal MPD1 which is a 4-times multiplied signal of the second period signal PDS2. The first multiplied signal MPD1 is fed back and inputted to the counter unit 2201 shown in FIG. 8. The third counting signal 4EV generated by the counter unit 2201 transits to a high level after a fourth pulse of the first multiplied signal MPD1 is inputted. If the third counting signal 4EV transits to a high level, the section signal SECT transits to a low level. Referring to FIG. 12, it can be appreciated that the section signal SECT maintains a high level from a section in which 199 μsec is elapsed after the clock signal stabilizing section is initiated to a section in which the fourth pulse of the first multiplied signal MPD1 is inputted.

Figure 11:
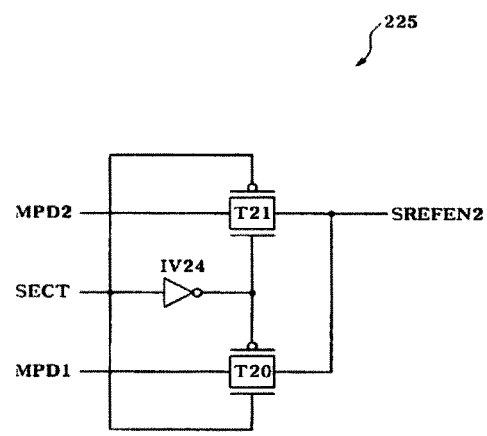
FIG. 11 is a circuit diagram showing a signal selector included in the first initialization unit of FIG. 7.

Next, referring to FIG. 11, the signal selector 225 transfers the first multiplied signal MPD1 as the second self-refresh enable signal SREFEN2 if the section signal SECT is at a high level. Therefore, as shown in FIG. 12, the second self-refresh enable signal SREFEN2 is generated with 4 pulses during a section in which the section signal SECT is enabled at a high level. The bank active signal BANKACT is also enabled 4 times by the second self-refresh enable signal SREFEN2 generated with 4 pulses. That is, the self-refresh operation is performed 4 times.

Next, even though the self-refresh signal SREF is inputted with a high level for the purpose of self-refresh operation, the self-refresh operation is performed 4 times. The explanation on the self-refresh operation is omitted since it is repeated with the operation of the bank active circuit shown in FIG. 3.

As described above, the bank active circuit according to this embodiment is allowed to perform the self-refresh operation 4 times during the section of approximately 1 μsec when 199 μsec is elapsed after the clock signal stabilizing section is initiated, even though the self-refresh signal SREF is not inputted. As such, if 4-times self-refresh operation is performed during the clock signal stabilizing section, it is possible to stabilize the internal voltage even though the auto-refresh operation is omitted at an initialization operation of the semiconductor memory device.

Figure 13:
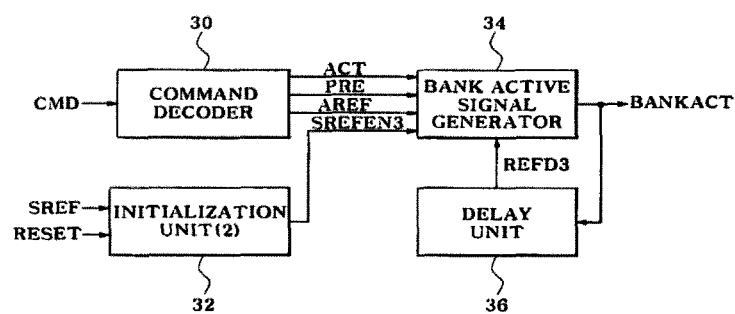
FIG. 13 is a block diagram showing the structure of the bank active circuit according to another embodiment of the present invention.

FIG. 13 is a block diagram illustrating a structure of a bank active circuit according to another embodiment of the present invention.

The bank active circuit shown in FIG. 13 consists of a command decoder 30, a second initialization unit 32, a bank active signal generator 34 and a delay unit 36. The bank active circuit according to this embodiment has the same structure as the bank active circuit shown in FIG. 6 except that the second initialization unit receives the reset signal RESET instead of the power-up signal PWRUP. The bank active circuit shown in FIG. 6 causes 4-times self-refresh operation to be performed during the clock signal stabilizing section, whereas the bank active circuit according to this embodiment (FIG. 13) allows 4-times self-refresh operation to be performed during a prescribed section after a prescribed section (for example, 199 μsec) is elapsed when the reset signal RESET with a high level is received. In other words, the bank active circuit according to this embodiment can be allowed to accomplish the self-refresh operation in the section determined by the reset signal RESET irrespective of the power-up section.

Herein, the reset signal RESET is enabled at a high level to enter into a reset mode supported from a Mode Register Read (MRR) mode in Low power DDR2 (LPDDR2). Therefore, the bank active circuit shown in FIG. 13 is preferably applied to LPDDR2.

The present application claims priority to Korean application number 10-2008-0123544, filed on Dec. 5, 2008, which is incorporated by reference in its entirety.

What is claimed is:

1. An initialization circuit, comprising:
 a section signal generator generating a section signal, a prescribed section of the section signal being enabled in response to a power-up signal;
 a first oscillator generating a first period signal in response to the section signal;
 a first period multiplier generating a first multiplied signal by multiplying a period of the first period signal; and
 a signal selector transferring a selected one of the first multiplied signal and a second multiplied signal as a self-refresh enable signal in response to the section signal,
 wherein the power-up signal has a level transition after a termination of a power-up section.

2. The initialization circuit of claim 1, wherein the section signal generator comprises:
 a timer generating a start signal in response to the power-up signal;
 a counter unit counting the first multiplied signal to generate a first counting signal; and
 a section controller generating the section signal in response to the start signal and the first counting signal.

3. The initialization circuit of claim 2, wherein the timer generates the start signal enabled when the prescribed section is elapsed after the power-up section in which a power source voltage is increased is terminated.

4. The initialization circuit of claim 2, wherein the counter unit comprises:
 a first counter counting the first multiplied signal to generate a second counting signal;
 a second counter counting the second counting signal to generate a third counting signal; and
 a third counter counting the third counting signal to generate the first counting signal.

5. The initialization circuit of claim 2, wherein the section controller comprises:
 a pull-up device pull-up driving the section signal in response to the start signal; and
 pull-down device pull-down driving the section signal in response to the first counting signal.

6. The initialization circuit of claim 1, wherein the signal selector comprises:
 a first transfer device transferring the first multiplied signal as the self-refresh enable signal in response to the section signal;
 a second transfer device transferring the second multiplied signal as the self-refresh enable signal in response to the section signal.

7. The initialization circuit of claim 1, further comprising:
 a second oscillator receiving a self-refresh signal and generate a second period signal; and
 a second period multiplier multiplying a period of the second period signal and generating the second multiplied signal.

* * * * *